United States Patent
Drescher

(10) Patent No.: US 9,720,031 B2
(45) Date of Patent: Aug. 1, 2017

(54) METHOD FOR INCREASING THE RELIABILITY OF TRANSDUCERS

(71) Applicant: Micronas GmbH, Freiburg (DE)

(72) Inventor: Michael Drescher, Freiburg (DE)

(73) Assignee: TDK—Micronas GmbH, Freiburg (DE)

( * ) Notice: Subject to any disclaimer, the term of this patent is extended or adjusted under 35 U.S.C. 154(b) by 155 days.

(21) Appl. No.: 14/937,344

(22) Filed: Nov. 10, 2015

(65) Prior Publication Data
US 2016/0131698 A1    May 12, 2016

(30) Foreign Application Priority Data

Nov. 10, 2014 (DE) .................... 10 2014 016 519

(51) Int. Cl.
| | | |
|---|---|---|
| G01R 31/28 | (2006.01) | |
| G01D 3/08 | (2006.01) | |
| G01D 21/00 | (2006.01) | |
| G01R 33/07 | (2006.01) | |

(52) U.S. Cl.
CPC .......... *G01R 31/2829* (2013.01); *G01D 3/08* (2013.01); *G01D 21/00* (2013.01); *G01R 31/2851* (2013.01); *G01R 33/07* (2013.01)

(58) Field of Classification Search
CPC ................................................ G01R 31/2829
See application file for complete search history.

(56) References Cited

U.S. PATENT DOCUMENTS

| | | | |
|---|---|---|---|
| 8,577,634 B2 | 11/2013 | Donovan et al. | |
| 8,805,638 B2 | 8/2014 | Morath | |
| 9,553,616 B2 * | 1/2017 | McCormack | ........ H04B 5/0031 |
| 2004/0015282 A1 | 1/2004 | Babala et al. | |
| 2009/0224784 A1 * | 9/2009 | Pagani | ............... G01R 31/3172 324/762.02 |
| 2011/0291679 A1 * | 12/2011 | Pagani | ............... G01R 31/3172 324/750.01 |
| 2012/0319890 A1 * | 12/2012 | McCormack | ........... G01S 13/04 342/118 |
| 2013/0128483 A1 * | 5/2013 | Sholten | ................... H01L 23/50 361/764 |

FOREIGN PATENT DOCUMENTS

| | | |
|---|---|---|
| DE | 20 2009 017 430 U1 | 6/2011 |
| DE | 10 2011 075 679 A1 | 11/2012 |
| WO | WO 2012/082207 A1 | 6/2012 |

* cited by examiner

*Primary Examiner* — Manuel L Barbee
*Assistant Examiner* — Raymond Nimox
(74) *Attorney, Agent, or Firm* — Muncy, Geissler, Olds & Lowe, P.C.

(57) ABSTRACT

A method for increasing the reliability of transducers, having a first and a second IC, the two ICs have exactly the same or substantially the same monolithically integrated circuit components, each with a sensor and a signal contact designed for bidirectional data transmission and a reference contact and a supply voltage contact. A signal generated as a function of the physical quantity sensed by the relevant sensor is applied to the signal contact. The signal of the first IC is compared with the signal of the second IC by a monitoring device, and then the result of the comparison is communicated to an enable device, and the signal of the first IC is sent by an enable device to the control unit if both signals lie in a predefined useful band.

8 Claims, 1 Drawing Sheet

METHOD FOR INCREASING THE RELIABILITY OF TRANSDUCERS

This nonprovisional application claims priority under 35 U.S.C. §119(a) to German Patent Application No. 10 2014 016 519.1, which was filed in Germany on Nov. 10, 2014, and which is herein incorporated by reference.

BACKGROUND OF THE INVENTION

Field of the Invention

The invention relates to a method for increasing the reliability of transducers.

Description of the Background Art

A sensor housing having two sensors and a first integrated circuit and a second integrated circuit is known from DE 20 2009 017 430 U1, which corresponds to U.S. Pat. No. 8,805,638.

Furthermore, an arrangement with two sensors is known from DE 10 2011 075 679 A1. In addition, the two documents each disclose a method for increasing the reliability of transducers, in particular of sensors.

Known from WO 2012/082207 A1, which corresponds to U.S. Pat. No. 8,577,634, is a method for transmitting data between a control unit and a sensor IC by means of the Single Edge Nibble Transmission (SENT) protocol.

SUMMARY OF THE INVENTION

It is therefore an object of the invention to provide a method for increasing the reliability of transducers that advances the state of the art.

According to an exemplary embodiment, a method for increasing the reliability of transducers is provided, having a method for increasing the reliability of transducers, having a first IC and a second IC, wherein the two ICs have exactly the same or substantially the same monolithically integrated circuit components, each with a sensor and a signal contact designed for bidirectional data transmission and a reference contact and a supply voltage contact, and the reference contact on each of the two ICs is connected to or disconnected from the signal contact via a controllable switch, and a signal generated as a function of the physical quantity sensed by the relevant sensor is applied in each case to the signal contact, and the two ICs, together with a monitoring unit and an enable unit, are integrated into a common IC package, or the monitoring unit and an enable unit are implemented in a separate IC package, and the supply voltage contact of the first IC and the supply voltage contact of the second IC are connected to the control unit, and the reference contact of the first IC and the reference contact of the second IC are connected to the control unit, and the signal of the first IC is compared with the signal of the second IC by means of a monitoring device, and then the result of the comparison is communicated to an enable device, and the signal of the first IC is sent by an enable device to the control unit if both signals lie in a predefined useful band.

The sensors can be implemented as magnetic field sensors and/or as temperature sensors and/or as pressure sensors. The signals determined as a function of the type of the sensor are applied to the signal contacts. Preferably the same circuit components are implemented and monolithically integrated in both ICs.

An advantage of the method according to the invention is that the signal of the first IC can be verified by a monitoring device, and a message is sent to the control unit in the event of a fault.

In this way, a redundancy is created in an advantageous manner. Especially in a Single Edge Nibble Transmission configuration, which is to say a SENT configuration, it is now possible according to the invention to replace an IC package that hitherto had only one single IC in the IC package with an IC package having two ICs. The reliability in monitoring the physical parameter is significantly increased. If one IC in the IC package fails, a cost-intensive and complex intervention in an existing assembly can be reduced. Such assemblies are installed primarily in motor vehicles, for example to detect the steering angle or to detect the position of the gas pedal.

In an embodiment, the supply voltage contact of the first IC and the supply voltage contact of the second IC can be connected jointly to a first package contact of the IC package, and the reference contact of the first IC and the reference contact of the second IC can be connected to a second package contact of the IC package, or in an alternative embodiment the supply voltage contact of the second IC can be connected to a fourth package contact of the IC package and/or the reference contact of the second IC is connected to a fifth package contact of the IC package. In particular, it is advantageous if each of the package contacts of the IC package is connected to one contact terminal of the control unit.

In an embodiment, in the first IC and in the second IC each signal can be generated as a pulse-width modulated signal by an open-drain output.

In an embodiment, the two ICs can be connected in a SENT compliant configuration. In particular, in a first embodiment here, signals from the first IC are transmitted to the control unit in a first part of the SENT protocol.

It is advantageous if the monitoring unit and the enable device can be monolithically integrated into the second IC. Alternatively, a total of three dice are arranged in the IC package, wherein the first die and the second die are always arranged in one package.

In an embodiment, the signal of the first IC can be overridden by the signal of the second IC if the first signal differs from the second signal and lies outside the useful band, and in a first alternative a fault can be signaled to the control unit in a PWM period, or in a second alternative a PWM period can be significantly shortened and the control unit detects a fault.

Hall effect sensors can be implemented in the two ICs, and the signals can each be generated as a function of the Hall voltage in the two ICs and applied to the signal contact of the relevant IC. It should be noted that the signals contain, e.g., location information. The location information contains, for example, angle information from a transmitter.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The invention is explained in detail below with reference to the drawings. Like parts are labeled with identical designations here. The embodiments shown are highly schematic, which is to say that the distances and lateral and vertical extent are not to scale, and unless otherwise specified do not have any derivable geometric relationship to one another. In the drawings.

DETAILED DESCRIPTION

Figure 1:
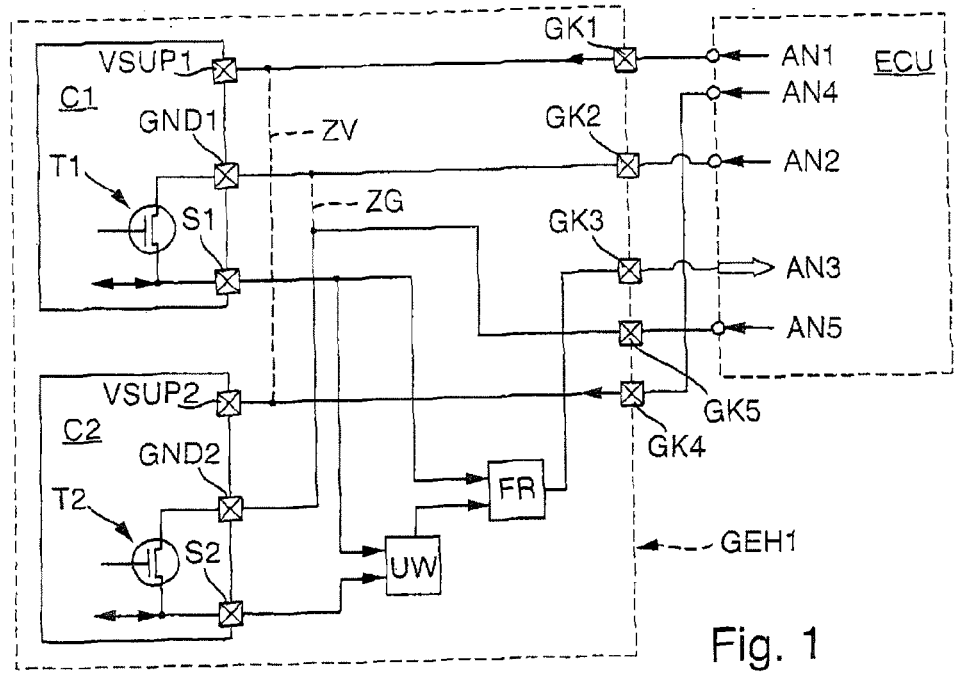
FIG. 1 shows a first circuit arrangement for carrying out the method according to an embodiment of the invention.

The illustration in FIG. 1 shows a circuit for carrying out the method according to the invention with a first IC C1 and a second IC C2, wherein the two ICs C1, C2 have the same monolithically integrated circuit components with one sensor apiece—not shown. Preferably, the two sensors are implemented as magnetic field sensors, in particular as Hall effect sensors. The two ICs C1, C2 are integrated into a common IC package GEH1.

The first IC C1 has a signal contact S1 designed for bidirectional data transmission, and the second IC C2 has a signal contact S2 designed for bidirectional data transmission. The first IC C1 has a reference contact GND1 and a supply voltage contact VSUP1. The second IC C2 has a reference contact GND2 and a supply voltage contact VSUP2. In each of the two ICs C1, C2, the applicable reference contact GND1 or GND2 is connected to the applicable signal contact S1, S2 by means of a controllable switch T1, T2. By means of a triggering at the control input, the applicable signal contact S1, S2 can be short-circuited to the applicable reference contact GND1 or GND2, and in this way generate so-called "open-drain" modulated signals at the signal contacts S1, S2.

The pulse-width modulated signal generated as a function of the physical quantity sensed by the applicable sensor is present at the applicable signal contact S1, S2.

The supply voltage contact VSUP1 of the first IC C1 is connected to a first package contact GK1 of the IC package GEH1. The reference contact GND1 of the first IC C1 is connected to a second package contact GK2 of the IC package GEH1. The signal contact S1 of the first IC C1 and the signal contact S2 of the second IC C2 are connected to a monitoring unit UW. In addition, the signal contact S1 of the first IC C1 and the monitoring unit UW are connected to an enable unit FR. The enable unit FR is connected to a third package contact GK3 of the IC package GEH1.

In a first alternative, the supply voltage contact VSUP2 of the second IC C2 is connected to the supply voltage contact VSUP1 of the first IC C1 by a line ZV. In a second alternative, the supply voltage contact VSUP2 of the second IC C2 is connected to a fourth package contact GK4.

In a first alternative, the reference contact GND1 of the first IC C1 is connected to the reference contact VSUP1 of the second IC C2 by a line ZG. In a second alternative, the reference contact GND2 of the second IC C2 is connected to a fifth package contact GK5.

The first package contact GK1 is connected to a first terminal AN1 of a control unit ECU, and the second package contact GK2 is connected to a second terminal AN2 of the control unit ECU.

The third package contact GK3 is connected to a third terminal AN3 of the control unit ECU, and the fourth package contact GK4 is connected to a fourth terminal AN4 of a control unit ECU, and the fifth package contact GK5 is connected to a fifth terminal AN5 of a control unit ECU.

The monitoring unit UW and the enable unit FR are located in the IC package together with the first IC C1 and the second IC C2.

If the physical representation of the signal of the first IC C1 matches the physical representation of the signal of the second IC C2 and lies within a useful band, the signal SIG1 of the first IC C1 is applied to the third package contact GK3 by means of the enable unit FR. If the two signals have a relatively large discrepancy so that at least one of the signals no longer lies in the useful band, a fault signal is applied to the third package contact GK3 by means of the enable unit FR.

Figure 2:
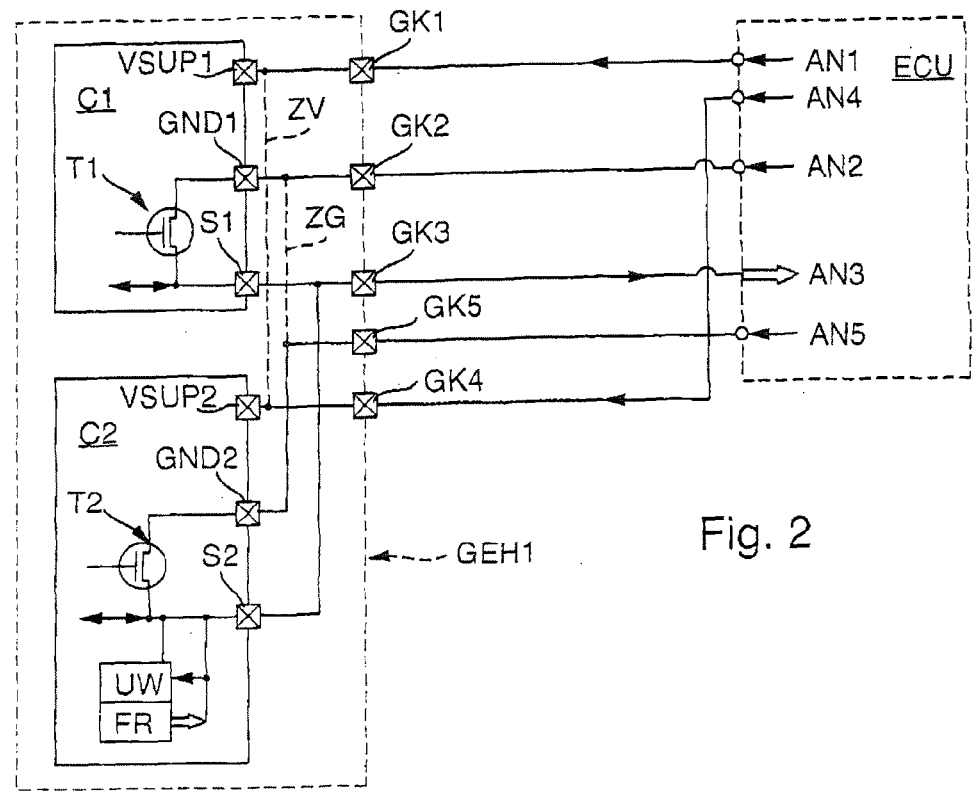
FIG. 2 shows a second circuit arrangement for carrying out the method according to an embodiment of the invention.

FIG. 2 shows a second embodiment. Only the differences from the embodiment shown in FIG. 1 are explained below. In the present case, the monitoring unit UW and the enable unit FR are monolithically integrated with the second IC C2.

The signal SIG1 of the first IC C1 is now internally compared in the second IC C2 with its own signal Sig2 of the second IC C2 in the second IC C2, and in the event of a positive result of the comparison, the signal Sig1 of the first IC C1 is applied to the package contact A1.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for increasing the reliability of transducers, the method comprising:
    providing a first IC and a second IC, the first and second IC have exactly the same or substantially the same monolithically integrated circuit components, each with a sensor and a signal contact designed for bidirectional data transmission and a reference contact and a supply voltage contact, the reference contact on each of the first and second IC being connected to or disconnected from the signal contact by a controllable switch;
    generating a signal as a function of a physical quantity sensed by a relevant sensor, the signal being applied in each case to the signal contact, wherein the first and second IC together with a monitoring unit and an enable unit are integrated into a common IC package or the monitoring unit and an enable unit are implemented in a separate IC package;
    connecting the supply voltage contact of the first IC and the supply voltage contact of the second IC to a control unit;
    connecting the reference contact of the first IC and the reference contact of the second IC to the control unit;
    comparing the signal of the first IC with the signal of the second IC by a monitoring device;
    communicating the result of the comparison to an enable device; and
    sending the signal of the first IC via an enable device to the control unit if both signals lie in a predefined useful band.

2. The method according to claim 1, wherein the supply voltage contact of the first IC and the supply voltage contact of the second IC are connected jointly to a first package contact of the IC package, wherein the reference contact of the first IC and the reference contact of the second IC are connected to a second package contact of the IC package, or wherein the supply voltage contact of the second IC is connected to a fourth package contact of the IC package, or wherein the reference contact of the second IC is connected to a fifth package contact of the IC package, and each of the package contacts is connected to a contact terminal.

3. The method according to claim 1, wherein, in the first IC and in the second IC, each signal is generated as a pulse-width modulated signal by an open-drain output.

4. The method according to claim 1, wherein the first IC is given priority over the second IC.

5. The method according to claim 1, wherein the first and second ICs are connected in a SENT configuration.

6. The method according to claim 1, wherein Hall effect sensors are implemented in the first and second ICs, and the signals are generated as a function of the Hall voltage in the applicable ICs.

7. The method according to claim 1, wherein the monitoring unit and the enable device are monolithically integrated into the second IC.

8. The method according to claim 7, wherein the signal of the first IC is overridden by the signal of the second IC if the first signal differs from the second signal and lies outside the useful band.

* * * * *